(12) United States Patent
Abou-Khalil et al.

(10) Patent No.: US 8,796,731 B2
(45) Date of Patent: Aug. 5, 2014

(54) LOW LEAKAGE, LOW CAPACITANCE ELECTROSTATIC DISCHARGE (ESD) SILICON CONTROLLED RECITIFER (SCR), METHODS OF MANUFACTURE AND DESIGN STRUCTURE

(75) Inventors: Michel J. Abou-Khalil, Essex Junction, VT (US); Shunhua T. Chang, South Burlington, VT (US); Kiran V. Chatty, Williston, VT (US); Robert J. Gauthier, Jr., Hinesburg, VT (US); Junjun Li, Williston, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 312 days.

(21) Appl. No.: 12/859,801

(22) Filed: Aug. 20, 2010

(65) Prior Publication Data
US 2012/0043583 A1 Feb. 23, 2012

(51) Int. Cl.
*H01L 29/861* (2006.01)
(52) U.S. Cl.
USPC .................................. 257/173; 257/E21.388
(58) Field of Classification Search
USPC .......... 257/157, E27.112, E21.388, 162, 146, 257/173, 107
See application file for complete search history.

(56) References Cited

U.S. PATENT DOCUMENTS

| | | | |
|---|---|---|---|
| 5,640,040 A | 6/1997 | Nakagawa et al. | |
| 5,773,868 A | 6/1998 | Endo | |
| 6,096,584 A | 8/2000 | Ellis-Monaghan et al. | |
| 6,303,413 B1 * | 10/2001 | Kalnitsky et al. | 438/151 |
| 6,605,493 B1 | 8/2003 | Yu | |
| 6,737,682 B1 * | 5/2004 | Yu | 257/173 |
| 6,750,515 B2 | 6/2004 | Ker et al. | |
| 6,909,149 B2 * | 6/2005 | Russ et al. | 257/355 |
| 6,921,931 B2 * | 7/2005 | Higashi et al. | 257/173 |
| 7,465,964 B2 | 12/2008 | Udrea | |
| 7,582,949 B2 | 9/2009 | Liu et al. | |
| 7,629,654 B2 | 12/2009 | Morris | |
| 2008/0036029 A1 * | 2/2008 | Liu et al. | 257/510 |
| 2008/0308837 A1 * | 12/2008 | Gauthier et al. | 257/107 |
| 2009/0026493 A1 * | 1/2009 | Hiraoka | 257/173 |
| 2009/0073621 A1 * | 3/2009 | Thijs et al. | 361/56 |
| 2010/0103570 A1 * | 4/2010 | Song et al. | 361/56 |
| 2010/0244090 A1 * | 9/2010 | Bobde et al. | 257/112 |

OTHER PUBLICATIONS

Voldman et al., "Semiconductor Process and Structural Optimization . . . ESD Networks", Downloaded Jan. 15, 2010 from IEEE Xplore, pp. 151-160.

* cited by examiner

*Primary Examiner* — Wael Fahmy
*Assistant Examiner* — Sarah Salerno
(74) *Attorney, Agent, or Firm* — Anthony Canale; Roberts Mlotkowski Safran & Cole, P.C.

(57) ABSTRACT

A low leakage, low capacitance diode based triggered electrostatic discharge (ESD) silicon controlled rectifiers (SCR), methods of manufacture and design structure are provided. The method includes providing a silicon film on an insulator layer. The method further includes forming isolation regions which extend from an upper side of the silicon layer to the insulator layer. The method further includes forming one or more diodes in the silicon layer, including a p+ region and an n+ region formed in a well bordered by the isolation regions. The isolation regions isolate the one or more diodes in a vertical direction and the insulator layer isolates the one or more diodes from an underlying P or N type substrate, in a horizontal direction.

23 Claims, 5 Drawing Sheets

LOW LEAKAGE, LOW CAPACITANCE ELECTROSTATIC DISCHARGE (ESD) SILICON CONTROLLED RECITIFER (SCR), METHODS OF MANUFACTURE AND DESIGN STRUCTURE

The invention relates to semiconductor structures and methods of manufacture and, more particularly, to low leakage, low capacitance electrostatic discharge (ESD) silicon controlled rectifiers (SCR), methods of manufacture and design structure.

BACKGROUND

Electrostatic discharge (ESD) protection is becoming ever more important as integrated circuits become smaller and smaller. There are several ways in which to provide ESD protection, each having their own advantages and disadvantages. One common approach is to use a string of diodes where the vertical PNP devices farm a Darlington amplifier and these series PNP devices are coupled with an SCR to form a diode-string triggered SCR (DTSCR). In fact, DTSCRs are becoming one of the dominant ESD protection devices for high frequency I/Os. However, such devices are known to have higher than ideal leakages due to the previously described darlington amplifier. The Darlington transistor network directs most of the current through the substrate at low currents.

Figure 1:
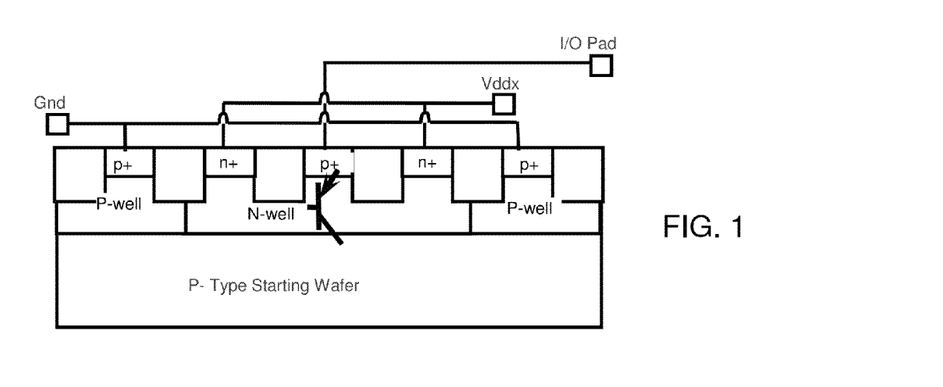
FIG. 1 shows a conventional lossy vertical PNP diode.

The Darlington amplifier is a compound structure consisting of two or more bipolar transistors connected in such a way that the current is amplified by each of the transistors. By way of example, FIG. 1 shows a vertical PNP device, which can result in a Darlington amplifier when two or more diodes are strung together. In the structure of FIG. 1, the PNP diode consists of a p+ region in an N-Well. The N-Well is formed directly on a P-type starting substrate. The p+ region is connected to an I/O pad and the n+ regions in the N-Well are connected to Vdd. The p+ regions (contacts) in the P-wells are connected to ground (GND), and provide current to the backside of the diode (collector region of the PNP).

In operation, current from the P+ diffusion into the N-well leaks into the P-type wafer, resulting in loss of current. That is, some current goes to the collector, compared to an ideal situation in which all of the current goes from the emitter to the base. As more diodes are strung together, though, the loss of current into the N-well becomes amplified resulting in a very lossy device. In some instances, depending on the number of diodes strung together, such structure is known to lose more current to the collector than which is received by the base.

Accordingly, there exists a need in the art to overcome the deficiencies and limitations described hereinabove.

SUMMARY

In a first aspect of the invention, a method comprises providing a silicon layer on an insulator layer. The method further comprises forming one or more diodes in the silicon layer, including a p+ region and an n+ region formed in a well. The method further comprises forming isolation regions on sides of the one or more diodes which extend from an upper side of the silicon layer to the insulator layer. The isolation regions isolate the one or more diodes in a vertical direction and the insulator layer isolates the one or more diodes from an underlying P or N type substrate, in a horizontal direction.

In another aspect of the invention, a method comprises providing a silicon on insulator (SOI) substrate, which comprises a buried dielectric layer between an upper silicon film and a lower silicon based substrate. The method further comprises forming deep trench isolation structures which extend from an upper side of the silicon film to the buried dielectric layer. The method further comprises forming one or more diodes in the silicon film, including a p+ region and an n+ region formed in a well bordered by the isolation regions. The deep trench isolation structures provide vertical isolation between the each of the diodes in the string of diodes, and the buried dielectric layer provides horizontal isolation between the well of each diode and the lower silicon based substrate to prevent loss of current.

In yet another aspect of the invention, a structure comprises a buried dielectric layer between an upper substrate and a lower substrate. The structure further comprises deep trench isolation structures extending from an upper surface of the upper substrate to the buried dielectric layer. The structure further comprises a series of shallow trench isolation bounded diodes in the upper substrate, which are each bound by the deep trench isolation structures and isolated from the lower substrate by the buried dielectric layer.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the low leakage, low capacitance diode based electrostatic discharge (ESD) silicon controlled rectifiers (SCR) (ESD SCR), which comprises the structures of the present invention. In still further embodiments, a method in a computer-aided design system is provided for generating a functional design model of the ESD SCR. The method comprises generating a functional representation of the structural elements of the ESD SCR.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to low leakage, low capacitance diode based electrostatic discharge (ESD) silicon controlled rectifiers (SCR), methods of manufacture and design structure. More specifically, the present invention is directed to low leakage vertical PNP (or NPN) triggered ESD SCRs, methods of manufacture and design structure. The structures of the present invention can be used as I/O ESD protection and, when used as a power supply, ESD protection on small voltage island power supplies where low Iddq is critical. Advantageously, the structures of the present invention can obtain an approximate 36.5% lower loading capacitance compared to a diode triggered SCR in BULK. Also, the structures of the present invention are capable of providing approximately 2 to 3 times lower leakage levels for I/O signals or low leakage supplies, compared to a comparable diode triggered SCR in BULK.

To accomplish the advantages of the present invention, in embodiments, isolation regions are formed between and underneath each of the diodes, in series, to reduce leakage into the underlying substrate; that is, advantageously, with implementations of the present invention, current injected into the diode string will not leak into the underlying substrate or collector region. Instead, the current will be maintained from the emitter to the base, via the isolated well region. In this way, the efficiency of the devices can be increased, compared to conventional lossy devices. Additionally, unlike conventional ESD SCR devices, the present invention can accommodate any number of diodes in a string without any additional leakage across the substrate.

Figure 2:
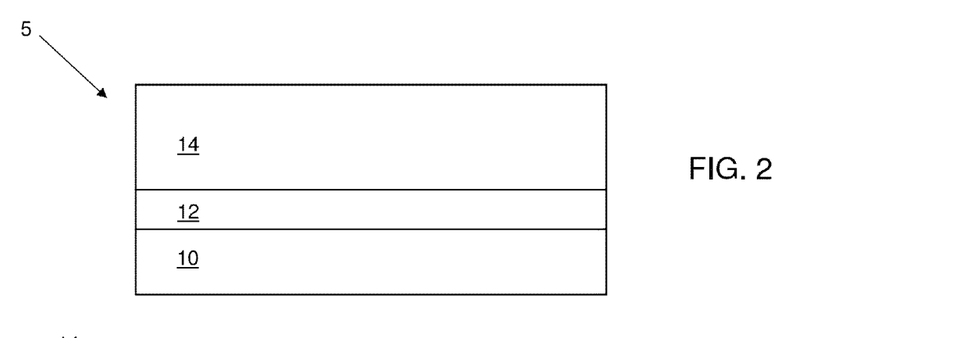
FIGS. 2-6 show a low leakage vertical PNP triggered ESD SCR and respective fabrication processes in accordance with aspects of the invention.

FIG. 2 shows a beginning structure 5 in accordance with aspects of the present invention. For example, the beginning structure 5 includes an underlying substrate 10, which may be, for example, a P-type silicon based substrate. In embodiments, the underlying substrate 10 can alternatively be an N-type substrate (when forming a NPN diode). A insulator layer (e.g., buried oxide layer) 12 is provided on the substrate 10, with a silicon (silicon based) wafer (substrate) 14 provided on the insulator layer 12. In embodiments, the insulator layer 12 will prevent leakage to the underlying substrate 10. The silicon layer above the oxide layer 12 can be about 0.5 microns to 1 micron in thickness and the insulator layer 12 can be about 0.1 microns to 1 micron in thickness.

In embodiments, the structure 5 can be formed by conventional fabrication steps. For example, in one embodiment, oxide layers on the substrate 10 and wafer 14 can be bonded together to form the structure 5. In other embodiments, the structure can be formed using conventional Separation-by-Implanted-Oxygen (SIMOX) technology. As should be understood by those of skill in the art such that no further explanation is required, SiMOX is a method of fabrication of silicon on-insulator structures and substrates by implanting high doses of oxygen and high temperature annealing.

Figure 3:
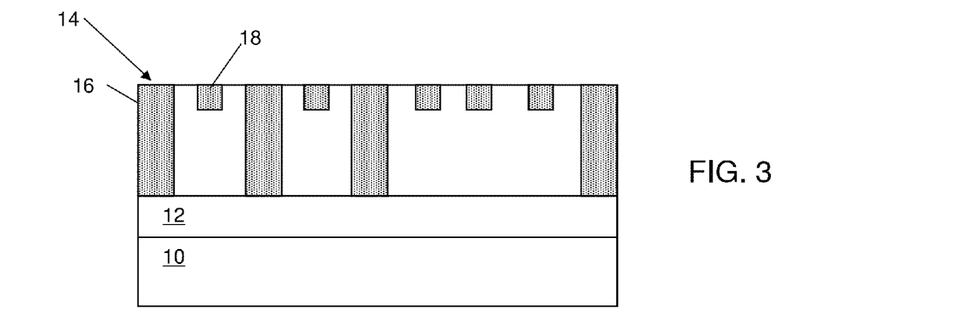

In FIG. 3, deep trench isolation structures 16 are formed in the silicon wafer 14 using conventional lithographic and etching processes. As discussed in more detail below, the deep trench isolation structures 16 will break any bipolar parasitic darlington resulting from a string of diodes. To form the deep trench isolation structures 16, in embodiments, a photoresist is deposited on the layer (also referred to as a film) 14 and exposed to light to form a pattern (holes). As should be understood by those of ordinary skill in the art, the pattern exposes portions of the layer 14 for subsequent etching steps. Trenches are then etched into the layer 14, to the insulator layer 12 (e.g., to a depth of about 0.5 microns to 1 micron, depending on the thickness of the silicon film above the insulating region 12). The trenches can be formed, for example, using conventional reactive ion etching (RIE). The trenches are then filled with an insulator material such as, for example, oxide. The insulator material can then be planarized to form the deep trench isolation structures 16. All of the deep trench isolation structures 16 can be formed at the same time, and can bound and/or border devices (e.g., diodes and SCR) formed using the silicon film 14 above the insulating region 12.

Still referring to FIG. 3, shallow trench isolation structures 18 are formed in the layer 14 using conventional lithographic and etching processes. The shallow trench isolation structures 18 are formed between the deep trench isolation structures 16, and are not as deep as the deep trench isolation structures 16. That is, the shallow trench isolation structures 18 do not extend to the underlying insulator layer 12. In embodiments, the shallow trench isolation structures 18 are formed by deposition of a photoresist on the layer 14, which is exposed to light to form a pattern (holes). Shallow trenches are then etched into the layer 14 using, for example, conventional reactive ion etching (RIE). The trenches are then filled with an insulator material such as, for example, oxide, or nitride or poly. The insulator material can be planarized to form the shallow trench isolation structures 18. In embodiments, the shallow trench isolation structures 18 can be formed before the deep trench isolation structures 16.

Figure 4:
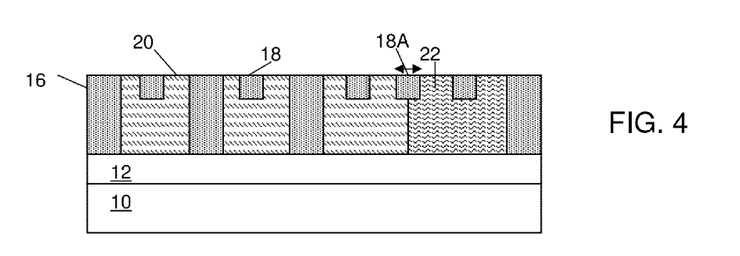

In FIG. 4, wells 20 and 22 are formed in the silicon film (layer) 14, between the deep trench isolation structures 16. The wells (which are used to form the diodes and SCR) sit directly on (e.g., in direct contact) the insulator layer 12 (e.g., buried oxide) and are bordered on sides by the deep trench isolation structure 16. In this way, the well of the SCR 400 (see, FIG. 5) sits directly on the insulator layer 12 (e.g., buried oxide) and is bordered on sides by the deep trench isolation structure 16 to reduce capacitance of the SCR.

In embodiments, the wells 20 are N-wells and the well 22 is a P-well to form an PNP diode and a P-well SCR; although, as discussed in greater detail below, the wells 20 can be P-wells and the well 22 can be an N-well (with an N type substrate 10) to form an NPN diode and N-well SCR. In embodiments, the wells 20, 22 can be formed by masking certain regions of the silicon film 14 and doping the unmasked regions. In embodiments, the N-wells 20 can be formed with phosphorous; although arsenic is also contemplated by the present invention. The P-well 22, on the other hand, can be formed from Boron. As further shown in FIG. 4, a tunable shallow trench isolation structure 18A is formed between the N-well 20 and the P-well 22, as represented by the double arrow. This will provide adjustable resistance for the SCR.

Figure 5:
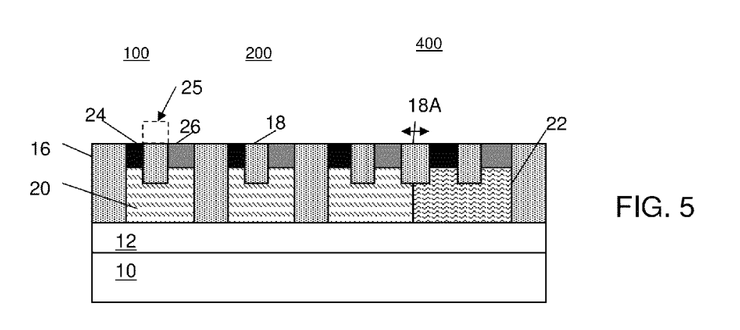

Referring now to FIG. 5, P+ and N+ regions are formed in the substrate using conventional source/drain processes. More specifically, a P+ region 24 and N+ region 26 are formed in the substrate on sides of gate structures 25 (shown out of plane in dashed lines). In embodiments, the gate structures 25 can be formed by conventional deposition and etching methods. By way of one example, a gate dielectric layer (e.g., oxide, hafnium oxide, or other known gate dielectric materials) is formed on the substrate, with a poly layer formed on the gate dielectric layer. After a patterning process to form the gate bodies, sidewall spacers such as nitride can then be formed on the sidewalls of the gate bodies.

After formation of the gate bodies, the P+ region 24 and N+ region 26 can be formed using conventional dopants and processes including, for example, pocket (halo) and extension implants. The P+ region 24 and N+ region 26 form source and drain regions, as well as P+/NW diodes 100, 200 and a PNPN thyristor (i.e., SCR) 400. The P+ region 24 and N+ region 26 are isolated from one another by the shallow trench isolation structures 18 (18A). To complete the structure, the structure can undergo an annealing process to form silicide regions, as well as metal contact formation on the gate body and source/drain regions.

In embodiments, the deep trench isolation structures 16 isolate the P+/NW diodes 100, 200, and the insulator layer 12 breaks any bipolar parasitic capacitance with the underlying substrate 10. In this way, the wells are isolated from one another and the underlying substrate 10, preventing any leakage to a collector (or into the underlying substrate 10), as well as reducing capacitance (of the SCR 400) for ESD protection.

Figure 6:
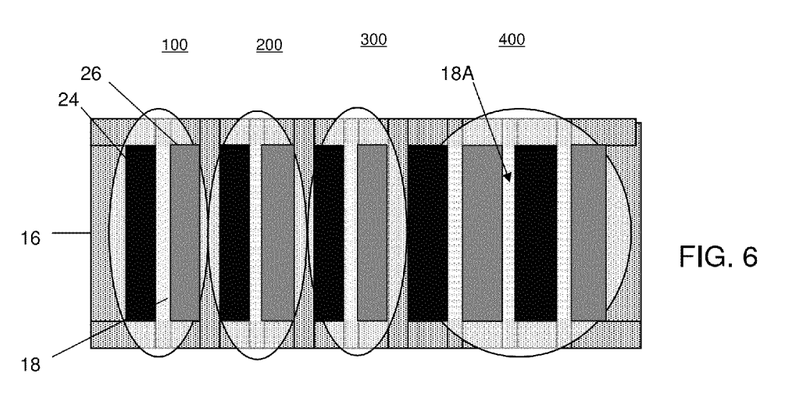

FIG. 6 shows a top view of a structure in accordance with the present invention. More specifically, FIG. 6 shows three (3) P+/NW diodes 100, 200, 300, in series, with an adjacent SCR 400. It should be understood by those of skill in the art that a string of more or less than three (3) P+/NW diodes can be formed using the processing steps described herein, with or without an SCR. For example, FIG. 5 shows two (2) P+/NW diodes, with an SCR adjacent to an end diode. As shown in the top view of FIG. 6, the P+/NW diodes 100, 200, 300, are bounded (isolated and/or bordered) by the deep trench isolation structures 16. Also, the SCR 400 is isolated from an adjacent diode 300 by the deep trench isolation structures 16 and more specifically, the SCR 400 is bounded by deep trench isolation structures 16 to reduce capacitance of the SCR 400. Additionally, as shown, the SCR 400 is composed of two P+ regions and two N+ regions, separated each by the shallow trench isolation structures 18.

Figure 7:
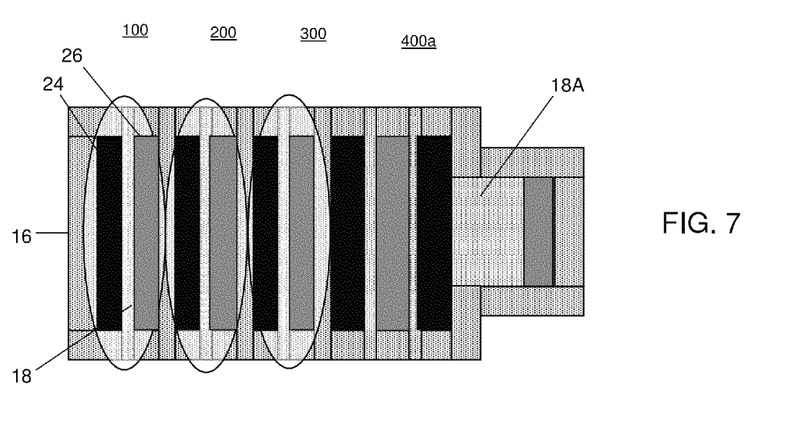
FIG. 7 shows a low leakage vertical PNP triggered ESD tunable SCR and fabrication processes in accordance with additional aspects of the invention.

FIG. 7 shows a top view of a structure in accordance with the present invention. As representatively shown in FIG. 7, the shallow trench isolation structure 18A can be adjusted in order to tune the turn on characteristics (e.g., resistance) of the SCR 400a. That is, by adjusting the size of the shallow trench isolation structure 18A, a built in resistance can be provided in the SCR. Also, as shown in FIG. 7 (as well as the other embodiments of the present invention), the SCR 400a is bounded by the deep trench isolation structures 16. This isolation allows a designer to advantageously provide a known resistance of the SCR 400a and reduce capacitance of the SCR 400a. As in the previous embodiment, the well of the SCR 400a sits directly on the insulator layer 12 (e.g., buried oxide) and is bordered on sides by the deep trench isolation structure 16 to reduce capacitance of the SCR 400a.

Figure 8:
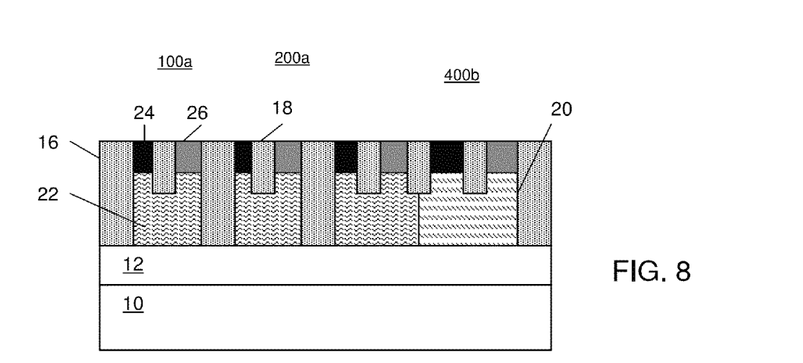
FIG. 8 shows a low leakage vertical NPN triggered ESD SCR and fabrication processes in accordance with additional aspects of the invention.

FIG. 8 shows a cross sectional view of a structure in accordance with the present invention. As representatively shown in FIG. 8, two (2) N+/PW diodes 100a, 200a are isolated from one another by a deep trench isolation structure 16. In this embodiment, the substrate is a N-type substrate and the P-wells 22 are formed in the manner described above, isolated from the substrate is a N-type substrate by the insulator layer 12. The N+/PW diode 200a is also isolated from the adjacent SCR 400b with a deep trench isolation structure 16. Also, as shown in FIG. 8 (as well as the other embodiments of the present invention), the SCR 400b is bounded by the deep trench isolation structures 16 to reduce capacitance of the SCR 400b. In embodiments, the SCR 400b can be a NPNP thyristor. As in the previous embodiment, the well of the SCR 400b sits directly on the insulator layer 12 (e.g., buried oxide) and is bordered on sides by the deep trench isolation structure 16 to reduce capacitance of the SCR 400b. As with the embodiments of the present invention, the turn on characteristics (resistance) of the SCR 400b can be tuned by the shallow trench isolation structure 18A.

Figure 9A:
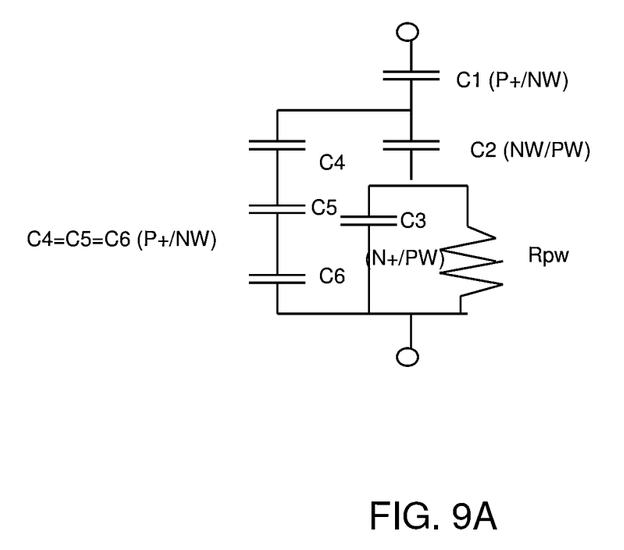
FIGS. 9A and 9B show electrical schematic diagrams of the low leakage ESD SCR in accordance with aspects of the invention.
Figure 9B:
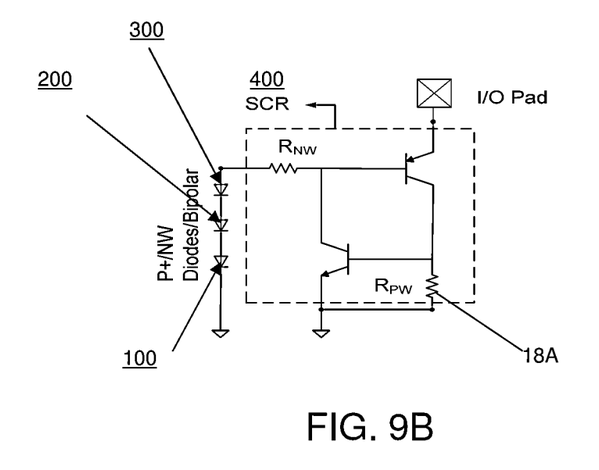

FIGS. 9A and 9B show electrical schematic diagrams of the low leakage ESD SCR in accordance with aspects of the invention. More specifically, FIG. 9A schematically shows the capacitance of the structure of FIG. 6 or 7, for example. FIG. 9A can also be representative of the structure of FIG. 8, with the exception of the different well types. In this representation, C1 and C4-C6 are the capacitance of a P+N-well diode. C2 is the capacitance of an N-well P-well and C3 is the capacitance of a N+ P-well of the SCR. Rpw is representative of the resistance of the SCR. Rpw is in parallel to C3 allowing C3 to be ignored in the capacitive loading calculation/estimation. In the representation of FIG. 9A, C4=C5=C6. Also, $$Ctot = C1*[(C2+(C4/3))/(C1+C2+(C4/3))] \quad (1).$$

Using the above equation (1), it becomes evident that the capacitance of the structure of the present invention is significantly lower than a conventional diode triggered SCR. For example, a total capacitance of a 300 um perimeter diode triggered SCR in accordance with the present invention is 59 fF. This is compared to a total capacitance of 93 fF for a conventional 300 um perimeter diode triggered SCR. As thus demonstrated, the structures of the present invention can obtain an approximate 36.5% lower loading capacitance compared to a diode triggered SCR in BULK. Also, the present invention is capable of providing approximately 2 to 3 times lower leakage levels for I/O signals or low leakage supplies, compared to a comparable diode triggered SCR in BULK.

FIG. 9B shows another electrical schematic representation of the present invention. In this representation, three P+/NW diodes 100, 200, 300 are provided in series and electrically connected to an I/O pad. The SCR 400 includes the tunable resistance, as represented by Rpw. The use of the tunable trigger currents with the trench isolated P-well allows use of external resistors to tune the trigger voltage/current. As should be understood, the ESD SCR 400 discharges ESD current to ground during a positive mode ESD event.

Figure 10:
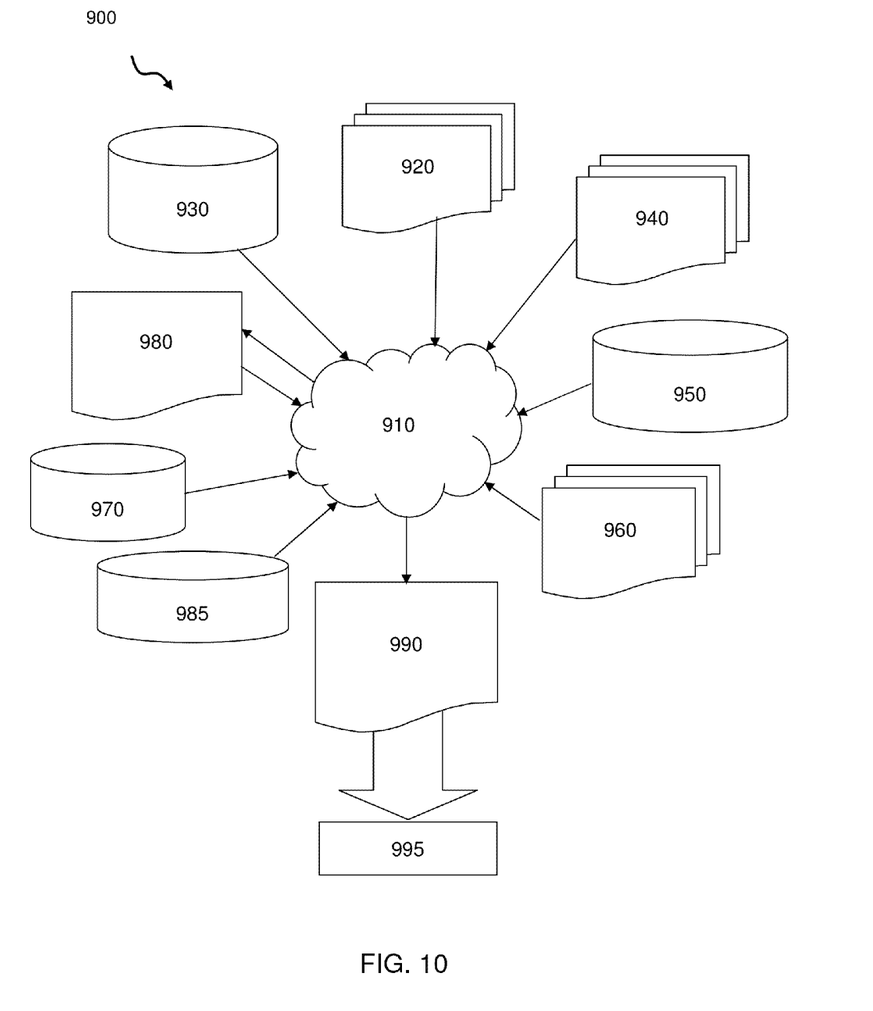
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 2-9B. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 2-9B. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 2-9B to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-9B. In one embodiment, design structure 990 may comprise a compiled, executable HDL simulation model that functionally simulates the devices shown in FIGS. 2-9B.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-9B. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method comprising:
providing a silicon film on an insulator layer;
forming isolation regions which extend from an upper side of the silicon film to contact a surface of the insulator layer; and
forming a plurality of diodes in the silicon film, each of the diodes including a p+ region and an n+ region formed in a well bordered by the isolation regions,
wherein the isolation regions isolate each of the plurality of diodes from one another in a vertical direction and the insulator layer isolates the plurality of diodes from an underlying P or N type substrate, in a horizontal direction.

2. The method of claim 1, further comprising forming a silicon controlled rectifier (SCR) on the silicon film.

3. The method of claim 2, further comprising bounding the SCR with deep trench isolation structures to reduce capacitance of the SCR and isolate the SCR from the plurality of diodes.

4. The method of claim 2, further comprising tuning the SCR by adjusting a size of a shallow trench isolation structure provided between two wells of the SCR.

5. The method of claim 1, wherein the isolation regions are deep trench isolation structures formed by etching trenches into the silicon film to the insulator layer, and filling the trenches with an insulator material.

6. The method of claim 1, wherein the insulator layer is a buried oxide (BOX) layer.

7. The method of claim 1, wherein the plurality of diodes are formed as shallow trench isolation (STI) bounded diodes.

8. The method of claim 1, wherein the silicon film on an insulator layer is a silicon on insulator (SOI) substrate.

9. The method of claim 1, wherein the silicon film has a thickness of at least 0.5 um.

10. A method comprising:
providing a silicon on insulator (SOI) substrate, which comprises a buried dielectric layer between an upper silicon film and a lower silicon based substrate;
forming deep trench isolation structures within the upper silicon film and extending to contact an upper surface of the buried dielectric layer; and
forming a string of diodes in the upper silicon film by forming wells in the upper silicon film, between the deep trench isolation structures, and forming p+ and n+ regions in the well, separated by a shallow trench isolation structure,
wherein the deep trench isolation structures provide vertical isolation between each of the diodes in the string of diodes, and the buried dielectric layer provides horizontal isolation between the well of each diode and the lower silicon based substrate to prevent loss of current.

11. The method of claim 10, wherein the upper silicon based substrate is at least 0.5 um thick.

12. The method of claim 10, wherein the buried dielectric layer is a buried oxide layer (BOX).

13. The method of claim 10, further comprising forming a silicon controlled rectifier (SCR) adjacent to one of the diodes in the string of diodes, wherein the SCR is isolated from the one of the diodes by one of the deep trench isolation structures.

14. The method of claim 13, wherein the deep trench isolation structures and the one of the deep trench isolation structures are formed at a same time.

15. The method of claim 10, wherein the string of diodes in the upper silicon based substrate are PNP diodes.

16. The method of claim 10, wherein the string of diodes in the upper silicon based substrate are NPN diodes.

17. A structure, comprising:
a buried dielectric layer between an upper substrate and a lower substrate;
deep trench isolation structures extending from an upper surface of the upper substrate to contact a surface of the buried dielectric layer; and
a plurality of shallow trench isolation bounded diodes in the upper substrate, which are each isolated from one another by the deep trench isolation structures and isolated from the lower substrate by the buried dielectric layer.

18. The structure of claim 17, further comprising an PNPN or NPNP thyristor formed in the upper substrate, and bounded by the deep trench isolation structures.

19. The structure of claim 18, wherein wells formed for the plurality of shallow trench isolation bounded diodes and the PNPN or NPNP thyristor are directly in contact with the buried dielectric layer.

20. The structure of claim 18, wherein the PNPN or NPNP thyristor are bordered on three sides by the deep trench isolation structures reduce capacitance.

21. The method of claim 1, further comprising forming a silicon controlled rectifier (SCR) with a well in the silicon film, wherein:
the isolation regions extend from the upper side of the silicon film to contact an upper side of the insulator layer;
a pair of isolation regions isolate each of the plurality of diodes in the vertical direction and a pair of isolation regions isolate the SCR in the vertical direction; and
the insulator layer isolates the SCR from the underlying P or N type substrate, in the horizontal direction.

22. The method of claim 21, wherein the well of each of the plurality of diodes and the well of the SCR sit directly on the insulator layer.

23. The method of claim 21, further comprising:
forming a shallow isolation region between each pair of isolation regions that isolate each of the plurality of diodes; and
forming at least one shallow isolation region between the pair of isolation regions that isolate the SCR,
wherein the shallow isolation region formed for each of the plurality of diodes extends only partially into the silicon film and is formed in the well such that the shallow trench region separates the p+ region from the n+ region in each of the plurality of diodes; and
the at least one shallow isolation region formed for the SCR is formed between two wells of the SCR and extends only partially into the silicon film.

* * * * *